Dec. 23, 1969 P. A. B. TOOMBS 3,485,739

METHOD FOR COATING A SURFACE OF A SUBSTRATE WITH AN INSULATING MATERIAL BY SPUTTERING

Filed May 25, 1966

Inventor
PETER A. B. TOOMBS
By [signature]
Attorney

United States Patent Office
3,485,739
Patented Dec. 23, 1969

3,485,739

METHOD FOR COATING A SURFACE OF A SUBSTRATE WITH AN INSULATING MATERIAL BY SPUTTERING

Peter Alan Birrell Toombs, Harlow, England, assignor to International Standard Electric Corporation, New York, N.Y., a corporation of Delaware Filed May 25, 1966, Ser. No. 552,875
Claims priority, application Great Britain, Aug. 20, 1965, 35,916/65
Int. Cl. C23c *15/00*
U.S. Cl. 204—192 3 Claims

ABSTRACT OF THE DISCLOSURE

This is a method of depositing a layer of an insulating material on a substrate by reducing said material to a stable conducting substance, sputtering said substance toward said substrate and oxidizing said substance to obtain said layer of the same insulating material on said substrate.

The invention relates to a method for coating a surface of a substrate with an insulating material by sputtering.

For the purposes of this specification reduction is defined as a lowering of the valence state of an element in combination and oxidation as increasing the valence state of an element in combination.

The invention provides a method for coating a surface of a substrate with an insulating material by sputtering, said insulating material existing in a form which may be reduced to a stable conducting compound, so that on sputtering said compound, either in an oxidizing atmosphere, or in an inert atmosphere followed by oxidation, a coating is obtained which is chemically identical to the original insulating material.

According to one feature of the invention said stable conducting compound is sputtered onto a surface using a masking technique, for example, in the formation of a capacitor.

According to another feature of the invention said substrate is silica or glass.

According to another feature of the invention said insulating material is a compound or stoichiometric material containing the barium titanate and lanthanum titanate radicals, for example, a stoichiometric composition of barium lanthanum titanate.

According to further features of the invention hydrogen and/or forming gas at an elevated temperature is the reducing atmosphere for said insulating material and oxygen or a gaseous oxide of nitrogen or sulphur, present either singularly or in a mixture with an inert gas, at a reduced pressure is the oxidizing atmosphere.

The manufacture of thin film capacitors often involves sputtering a metal in an oxidizing atmosphere, for example, in the preparation of tantalum pentoxide, silicon monoxide and silicon dioxide capacitors. On an average the highest value of capacitance per unit area for silicon monoxide and silicon dioxide capacitors is 0.02 $\mu$f./cm.$^2$, while for a tantalum pentoxide capacitor it is 0.1 $\mu$f./cm.$^2$. The present invention provides a method whereby it is possible to obtain thin film capacitors having a higher capacitance per unit area, i.e. in the order of 2.0 $\mu$f./cm.$^2$ by a process of reactive sputtering. Insulating materials cannot be sputtered directly since there is a build up of surface charge on the substrate which raises the potential of the cathode surface to the potential of the surroundings so that there is no longer acceleration of positive ions to the cathode. However if an insulating material, for example a stoichiometric composition of barium lanthanum titanate can be reduced to a stable state in which it is conductive it may be sputtered in this condition in an oxidizing atmosphere to produce a film chemically identical to the original insulating material. This technique may be applied to any insulator which can be reduced to a conducting state and is stable in this state.

The foregoing and other features according to the invention will be understood from the following example with reference to the accompanying drawings in which FIGURE 1 is a diagrammatical representation of a cross section of a modified version of a sputtering apparatus, known to those familiar with the art.

Figures 1, 2, 3:
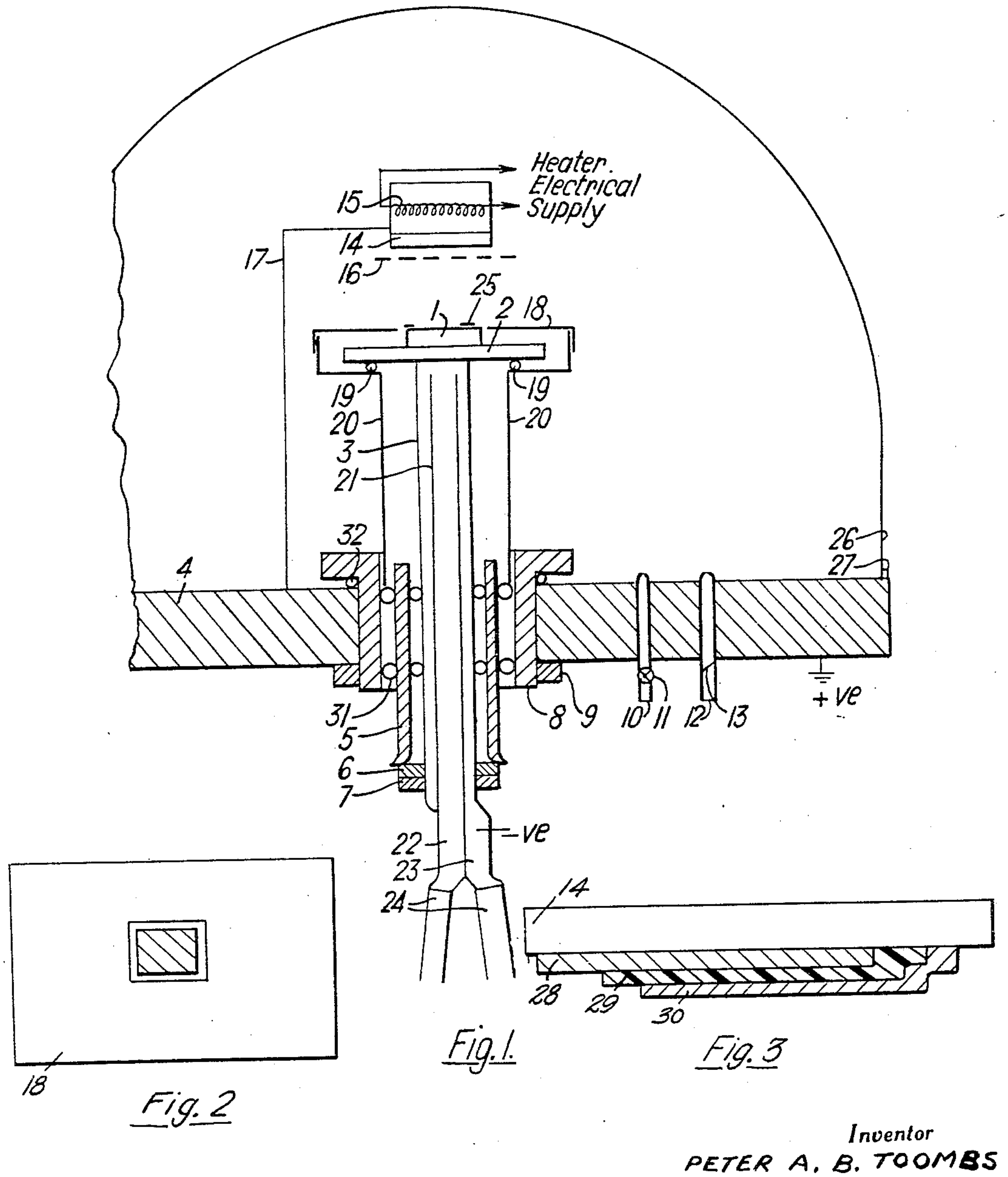
FIGURE 2 is a diagrammatical representation of a plan view of the cathode.
FIGURE 3 is a diagrammatical representation of a cross section of a thin film capacitor as produced from said apparatus.

Referring to FIGURES 1 and 2; for the production of a barium lanthanum titanate thin film capacitor the first cathode electrode 1 is a sheet of pure platinum, of approximate size 2 x 1 x ¼ inches, having a rectangular cross section and is located on a flat copper base block 2 having a thin walled copper tube 3 extending from the lower surface and held at a negative potential by an unsmoothed but rectified supply.

A stainless steel base plate 4 of approximately one inch thickness is made the positive side of the high tension supply and is earthed so that it, and contacting conducting parts are the anode electrode. A flared pyrex tube 5, held in position by means of a rubber cushion 6 and a lock collar 7 surrounds tube 3, acting as an insulating spacer between said tube and a circular brass lead through bush 8 and separated from each by O-rings 31 which also perform a sealing function. The lead through bush fits within a circular hole in the base plate, and is sealed therein by virtue of an O-ring 32, tightening of the nut 9 serves to hold the cathode and its surround firmly to the base plate. The latter contains two channels, one 10 for the entry of required gases which are controlled by a needle valve 11 and the other 12 containing a one-way valve 13 leads to a pump for purposes of evacuation.

The substrate 14 to be coated is a clean sheet of fused silica and is held by clipping to the heater 15 positioned so that the substrate is approximately one eighth of an inch beyond the limit of the cathode dark space 16 and held by a support 17 from the base plate. A cover 18, placed approximately one eighth of an inch from the platinum cathode electrode helps to local sputtering and is insulated from the copper base block by a ceramic spacer 19, and is supported by an outer copper shield 20 which slots into the gap between Pyrex tube 5 and lead through bush 8, and touches the inner surface of the latter.

An inner tube 21 provides means whereby water may be circulated to cool the cathode and base block, the inlet 22 and outlet 23 are connected to rubber hoses 24 of an approximate length of six feet to prevent a high leakage current through the water. With reference to FIGURES 1 and 3, an ink mask 25 is applied to the cathode electrode and a glass chamber 26, having a rubber seal 27 is fitted to cover the apparatus above the level of the base plate. The chamber is then evacuated to a pressure of less than $10^{-6}$ Torr and argon fed in via inlet 12 to a pressure of approximately $5\times10^{-2}$ Torr. Water is circulated via tube 23 to cool the cathode and when the substrate heater has maintained a temperature of approximately 900° C. an electrical discharge in the order of 1.5 kilovolts is created between the electrodes to provide a cathode current density of approximately 1 ma./cm.$^2$, whereby the cathode electrode is slowly disintegrated by bombardment of ionised gas molecules. The disintegrated platinum leaves the cathode surface, some of the liberated atoms condense on the silica substrate 14 and surrounding area, and the remainder return to the cathode. With constant cathode current density and gas pressure the rate of sputtering is dependent on the distance of cathode from substrate. For the above mentioned conditions a sputtering rate of between ten and one hundred angstroms per minute is achieved until the platinum film 28 has a depth determined by interferometry of approximately one thousand angstroms.

On completion of platinum sputtering, air is allowed in the chamber until atmospheric pressure is reached, after which the platinum cathode is replaced by a cathode of similar dimensions, made by reducing barium lanthanum titanate in hydrogen or forming gas at 1000° C. The substrate is remasked and the cathode is re-sputtered in an atmosphere of 5:1 mixture of argon and oxygen under conditions of approximately a cathode current density of 1.5/ma./cm.$^2$ and a pressure of $5\times10^{-2}$ Torr, until the desired thickness, between two thousand angstroms and ten thousand angstroms of barium lanthanum titanate 29 is obtained after which the cathode is removed at atmospheric pressure. The substrate is remasked and aluminum evaporated in vacuum within the chamber to a depth of approximately one thousand angstroms, for counter electrodes 30.

With optimum film depth the thin film capacitor obtained has characteristics in the order of 2.0 $\mu$f./cm.$^2$ for the capacitance per unit area, with a loss tangent of 3% and a breakdown voltage of 10 volts. The use of barium lanthanum titanate serves to depress the Curie point and consequently capacitors are produced in which capacitance changes are minimal.

While the invention has been described using a particular apparatus as applied to the manufacture of a capacitor, it will be apparent that other sputtering apparatus may be used for the production of articles requiring insulating films and that the invention may be applied to any insulator which man be reduced to a stable conducting state and either re-sputtered in an oxidizing atmosphere or re-sputtered in an inert atmosphere and then re-oxidised.

It is to be understood that the foregoing description of specific examples of this invention is made by way of example only and is not to be considered as a limitation on its scope.

What I claim is:

1. A process for manufacturing a capacitor, comprising the steps of:

coating a substrate with a first electrode in the form of a metallic layer;

reducing an insulating material to a stable conducting substance to form an additional electrode;

sputtering said conducting substance from said additional electrode toward said first electrode;

oxidizing said sputtered substance to obtain said layer of said insulating material; and coating said layer of said insulating material with a second electrode in the form of a metallic layer.

2. A process according to claim 1, wherein said insulating material comprises barium lanthanum titanate.

3. A process according to claim 2, wherein said conducting substance is obtained by high temperature reduction of barium lanthanum titanate in an atmosphere including hydrogen.

References Cited

UNITED STATES PATENTS

| | | | |
|---|---|---|---|
| 2,922,730 | 1/1960 | Feldman | 117—221 |
| 3,220,938 | 11/1965 | McLean et al. | 204—15 |
| 3,223,601 | 12/1965 | Henri | 204—56 |
| 3,309,302 | 3/1967 | Heil | 204—192 |
| 3,336,211 | 8/1967 | Mayer | 204—192 |
| 3,287,243 | 11/1966 | Ligenza | 204—192 |
| 3,438,885 | 4/1969 | Lewis et al. | 204—192 |

FOREIGN PATENTS

| | | |
|---|---|---|
| 884,943 | 4/1960 | England. |

OTHER REFERENCES

Anderson et al., Sputtering of Dielectrics by High-Frequency Fields, Journal of Applied Physics, vol. 33, No. 10, October 1962, pp. 2991–2.

JOHN H. MACK, Primary Examiner

S. S. KANTER, Assistant Examiner

U.S. Cl. X.R.

117—221